US011073553B2

(12) United States Patent
Pradeep et al.

(10) Patent No.: US 11,073,553 B2
(45) Date of Patent: Jul. 27, 2021

(54) DYNAMIC GENERATION OF ATPG MODE SIGNALS FOR TESTING MULTIPATH MEMORY CIRCUIT

(71) Applicant: TEXAS INSTRUMENTS INCORPORATED, Dallas, TX (US)

(72) Inventors: Wilson Pradeep, Bangalore (IN); Prakash Narayanan, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 37 days.

(21) Appl. No.: 16/185,629

(22) Filed: Nov. 9, 2018

(65) Prior Publication Data

US 2019/0206507 A1 Jul. 4, 2019

Related U.S. Application Data

(60) Provisional application No. 62/611,676, filed on Dec. 29, 2017, provisional application No. 62/611,704, filed on Dec. 29, 2017.

(51) Int. Cl.
| | |
|---|---|
| *G11C 29/42* | (2006.01) |
| *G11C 29/36* | (2006.01) |
| *G06F 11/10* | (2006.01) |
| *G01R 31/3177* | (2006.01) |
| *G01R 31/317* | (2006.01) |
| *G11C 29/56* | (2006.01) |

(52) U.S. Cl.
CPC ... *G01R 31/3177* (2013.01); *G01R 31/31718* (2013.01); *G01R 31/31724* (2013.01); *G06F 11/1048* (2013.01); *G06F 11/1068* (2013.01); *G11C 29/36* (2013.01); *G11C 29/42* (2013.01); *G11C 29/56004* (2013.01); *G11C 2029/3602* (2013.01); *G11C 2029/5602* (2013.01)

(58) Field of Classification Search
None
See application file for complete search history.

(56) References Cited

U.S. PATENT DOCUMENTS

| | | | | |
|---|---|---|---|---|
| 7,505,353 B2* | 3/2009 | Kim | ..................... | G11C 7/1075 365/189.02 |
| 7,913,138 B2* | 3/2011 | Sawamura | ....... | G01R 31/31726 714/731 |
| 8,261,138 B2* | 9/2012 | Chang | ..................... | G11C 8/16 714/718 |
| 8,356,231 B2* | 1/2013 | Cornwell | ............... | G11C 29/52 714/764 |
| 8,924,786 B2* | 12/2014 | Menon | ................. | G11C 29/022 714/25 |
| 9,003,255 B2* | 4/2015 | Kohli | ..................... | G11C 29/14 714/738 |

(Continued)

*Primary Examiner* — Phung M Chung
(74) *Attorney, Agent, or Firm* — Ebby Abraham; Charles A. Brill; Frank D. Cimino

(57) ABSTRACT

A circuit includes a multipath memory having multiple cells and a plurality of sequence generators. Each sequence generator of the plurality of sequence generators drives one separate cell of the multiple cells via an automatic test pattern generator (ATPG) mode signal for each cell. The ATPG mode signal for each cell is configured via a sequence configuration input that controls a timing sequence to test each cell. The state of the ATPG mode signal of each cell selects whether test data or functional data is output from the respective cell.

18 Claims, 6 Drawing Sheets

(56) References Cited

U.S. PATENT DOCUMENTS 9,812,219 B2 * 11/2017 Kohli .................... G11C 29/24
10,037,244 B2 * 7/2018 Chung .................... G06F 3/064
10,535,416 B2 * 1/2020 Kohli .................... G11C 29/00

* cited by examiner

DYNAMIC GENERATION OF ATPG MODE SIGNALS FOR TESTING MULTIPATH MEMORY CIRCUIT

CROSS REFERENCE TO RELATED APPLICATIONS

This application claims the benefit of U.S. Provisional Patent Application 62/611,676 filed on 29 Dec. 2017, and entitled DYNAMIC GENERATION OF ATPG MODE SIGNALS FOR TESTING MULTIPATH MEMORY CIRCUIT, the entirety of which is incorporated by reference herein. This application also claims the benefit of U.S. Provisional Patent Application 62/611,704 filed on 29 Dec. 2017, and entitled PATH BASED CONTROLS FOR ATE MODE TESTING OF MULTICELL MEMORY CIRCUIT, the entirety of which is incorporated by reference herein.

TECHNICAL FIELD

This disclosure relates to memory circuits, and more particularly to dynamic generation of automatic test pattern generator (ATPG) signals having configurable timing sequences for independent cell testing of multiple cells in a multipath memory.

BACKGROUND

The higher clock frequencies and smaller geometry sizes in today's integrated circuits have led to an increase in speed related defects which are commonly referred as transition delay faults. Thus, it is desirable that the devices are screened for such faults using at-speed testing. Effective scan-based at-speed test techniques are available in leading automated test pattern generator (ATPG) tools. The most common at-speed tests to check for manufacturing defects and process variations include test patterns created for transition and path-delay fault models. With increase in the memory content in respective designs to be tested, more and more critical testing paths are related to memory interface paths. Memory interface paths currently are tested using two different methods—ATPG testing and built-in self testing (GIST). In both cases, the actual true data path starting at functional logic and passing through the functional interface of the memory is generally not tested.

Random access memory (RAM) sequential ATPG is an ATPG method to cover the memory functional interface path. It tests memories through the actual timing critical paths by generating effective memory interface structural tests. Various challenges exist in generating suitable quality Ram-sequential patterns with higher test-coverage and optimized test-pattern count for memory dominated designs. One of these challenges includes complex memory architectures such as memory implementations which contain memory self-loops and/or other testing paths within a larger memory structure to be tested. Another challenge includes ATPG controllability and observability issues due to inflated fan-in/fan-out requirements and increased logic depth due to complex arbitration logic for the respective memories.

SUMMARY

This disclosure relates to dynamic generation of automatic test pattern generator (ATPG) signals having configurable timing sequences for independent cell testing of multiple cells in a multipath memory. In one example, a circuit includes a multipath memory having multiple cells and a plurality of sequence generators. Each sequence generator of the plurality of sequence generators drives one separate cell of the multiple cells via an automatic test pattern generator (ATPG) mode signal for each cell. The ATPG mode signal for each cell is configured via a sequence configuration input that controls a timing sequence to test each cell. The state of the ATPG mode signal of each cell selects whether test data or functional data is output from the respective cell.

In another example, a circuit includes a multipath memory having multiple cells and a plurality of sequence generators. Each sequence generator of the plurality of sequence generators drives one separate cell of the multiple cells via an automatic test pattern generator (ATPG) mode signal for each cell. The ATPG mode signal for each cell is configured via a sequence configuration input that controls a number of test pulses and a pulse width for the test pulses to test each cell. Each cell of the multipath memory includes a memory array to store functional data for the cell and an input multiplexer to select between a test interface and a functional interface in response to a test mode signal that varies between test mode and functional mode. The test interface provides test data for the cell via an output of the input multiplexer if the test mode signal is in test mode and the functional interface provides functional data to the memory array via the output of the input multiplexor if the test mode signal is in functional mode. A clocked logic array in each cell is driven from the output of the input multiplexor. The clocked logic array receives the test data for the cell in the test mode. An output multiplexer in each cell selects between the clocked logic array and the memory array in response to the ATPG mode signal. The ATPG mode signal causes the output multiplexer to provide clocked logic array output from the cell in test mode and to provide memory array output from the cell in functional mode.

In yet another example, a method includes generating a sequence configuration pattern that controls a number of test pulses and timing sequence for the test pulses to test a multipath memory. The method includes generating an automatic test pattern generator (ATPG) mode signal having the number of test pulses and the timing sequence in response to the sequence configuration pattern. The method includes routing test data or functional data from the multipath memory in response to the test pulses and the timing sequence of the ATPG mode signal.

DETAILED DESCRIPTION

This disclosure relates to dynamic generation of automatic test pattern generator (ATPG) signals having dynamically configurable timing sequences for independent cell testing of multiple cells in a multipath memory. A programmable sequence generator can be installed in a testing path for each cell of the multipath memory to enable dynamic testing of the cell while isolating the cell from other circuit paths during the test. The sequence generator allows for individually testing one portion of the multipath memory according to a desired testing sequence and timing (e.g., delay fault testing) while other controls isolate the current testing portion and allow for concurrent testing of another portion of the memory in parallel according to other functional and/or test conditions. By isolating testing controls and timing across different testing paths of the multipath memory, test pattern complexity can be reduced which facilitates higher circuit testing speeds and allows for more thorough testing of each path in the memory. This increases the overall testing coverage for the multipath memory which increases the quality of results (QOR) for the respective tests.

In some multipath memory circuit examples, error checking feature support is generally added to the memories. Thus, during a write operation for example, error checking bits/data for data being stored in a data portion of the multipath memory can be computed and stored in an associated error checking and correction (ECC) portion of the multipath memory. During a read operation to the multipath memory, the ECC data is again computed and compared to the stored ECC data in the ECC memory. In the case of an ATPG test, it becomes apparent that the ATPG tool has to control both of these memory instances in the multipath memory. Thus, current testing methods propagate the desired data through both of these memories concurrently to suitably test the circuit. Current testing methods generate complex ATPG patterns to satisfy both the ECC memory and the data memory of the multipath memory, for example. The programmable sequence generator and associated controls described herein allow for individual sequence control of separate portions of the multipath memory such as ECC memory and data memory which reduces the complexity of testing which in turn increases pattern count and fault coverage.

Figure 1:
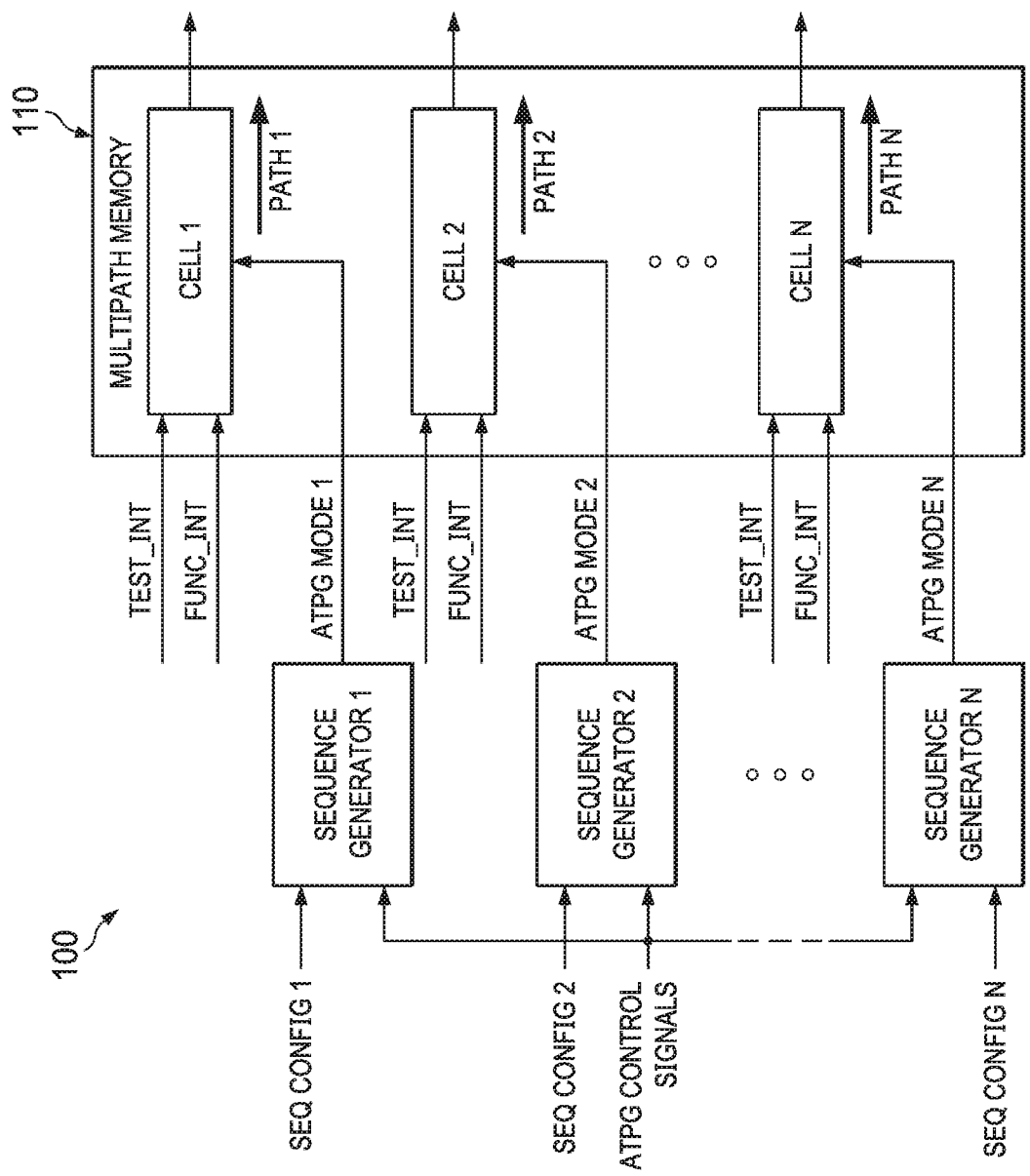
FIG. 1 illustrates an example block diagram of a circuit for testing cells of a multipath memory according to configurable sequential testing sequences applied to individual cells of the memory.

FIG. 1 illustrates an example circuit 100 for testing cells of a multipath memory according to configurable sequential testing sequences applied to individual cells of the memory. As used herein, the term multipath memory refers to a collection of cells that collectively contribute to provide an overall output data result from the multipath memory. Each cell provides a different memory function yet in some manner is responsible for the output data result. One example of a multipath memory is a data memory that provides one path of the memory and an associated error checking and correction (ECC) memory providing another path that is updated when the data memory is written to and read from. Other multipath memory types are possible however. Also, as used herein, the term cell refers to a circuit that contains a memory array along with other components that allow functional operation of the memory array in functional mode along with testing of the memory array in test mode. As used herein, the term "circuit" can include a collection of active and/or passive elements that perform a circuit function, such as an analog circuit or control circuit. Additionally, or alternatively, for example, the term "circuit" can include an integrated circuit (IC) where all and/or some of the circuit elements are fabricated on a common substrate (e.g., semiconductor substrate).

The circuit 100 includes a multipath memory 110 having multiple cells 1 through N and a plurality of sequence generators shown as sequence generators 1 through N, with N being a positive integer. Each sequence generator of the plurality of sequence generators 1-N drives one separate cell of the multiple cells 1-N via an automatic test pattern generator (ATPG) mode signal for each cell which is shown as ATPG mode 1 through N. Other ATPG control signals can be applied to the sequence generators 1-N to control the timing sequences applied to the cells 1-N (see e.g., FIG. 5). The ATPG mode signal 1-N for each cell is configured via a sequence configuration input shown as SEQ CONFIG 1 through N that controls a timing sequence to test each cell. Other ATPG control signals can be applied to the sequence generators 1-N to control the timing sequences applied to the cells 1-N (see e.g., FIG. 5). The state of the ATPG mode signal of each cell selects whether test data or functional data is output from the respective cell. Other test signals (not shown) select whether a test interface TEST_INT or a functional interface FUNC_INT is applied to the respective cell 1-N. The test interface and/or functional interface can be exercised by a testing system (not shown) (e.g., ATE and/or ATPG) that utilizes a generic test protocol, an IEEE 1500-based protocol, or a joint test action group (JTAG) protocol, for example. The functional interface can also be selected during normal use of the multipath memory 110 outside of the testing environment.

Each cell 1-N of the multipath memory 110 can include a memory array. In one example, one of the cells includes an error checking and correction (ECC) memory array and another one of the cells includes a data memory array. The ECC memory array stores an ECC bit that corresponds to data that is stored in the data memory array. Gate logic (see e.g., FIG. 2) receives data from the ECC memory array and the data memory array to generate output data corresponding to the data in the ECC memory array or the data memory array. As will be illustrated and described below with respect to FIG. 2, each sequence generator 1-N can include a sequence configuration register to configure the timing sequence of the ATPG mode signal 1-N to test each cell 1-N. The timing sequence includes a number of test pulses and a pulse width for the test pulses of the ATPG mode signal 1-N to test each cell. Other aspects of the configuration register and timing are illustrated and described below with respect to FIGS. 5 and 6.

Figure 2:
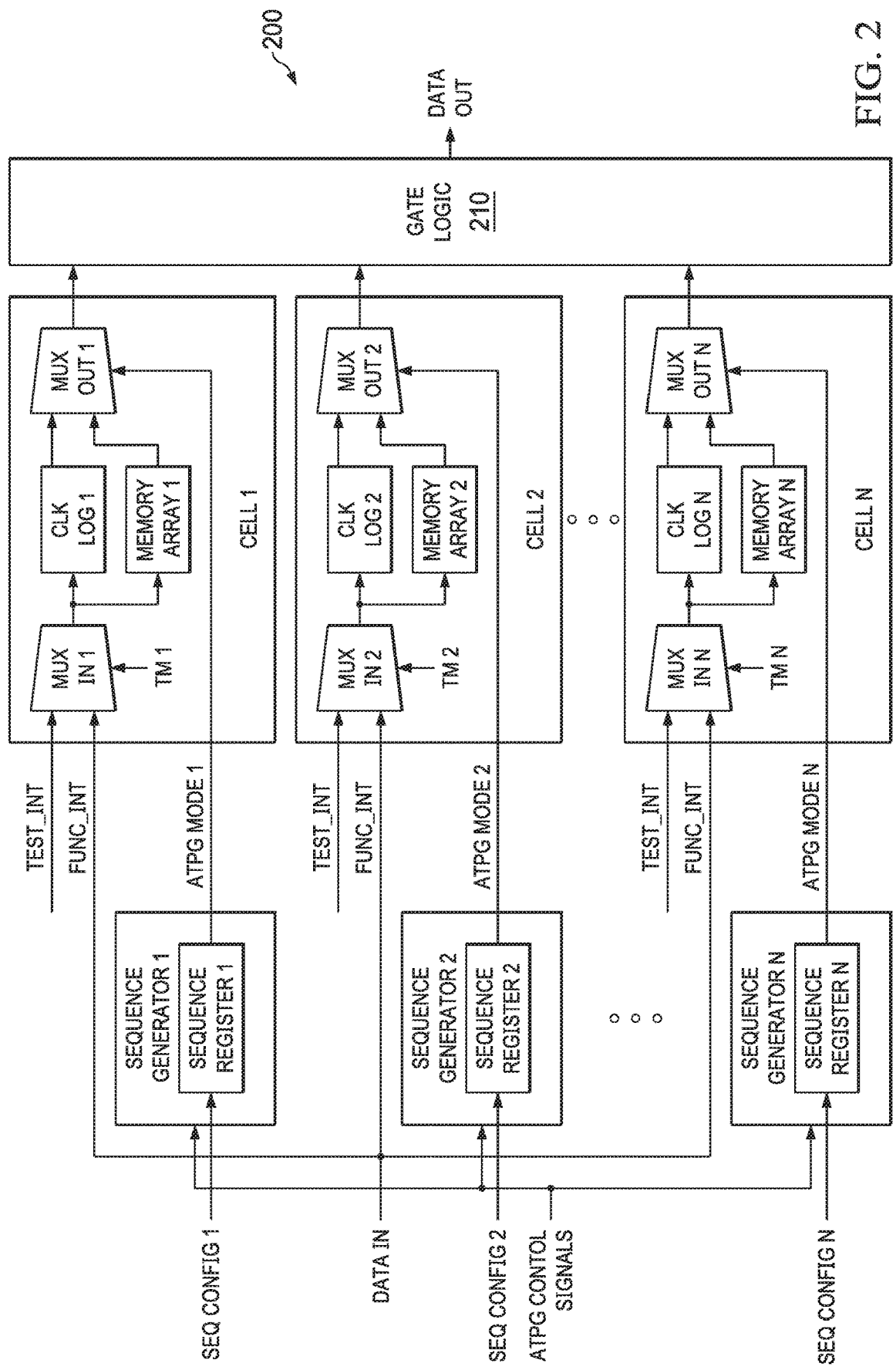
FIG. 2 illustrates an example block diagram of a circuit for testing and controlling cells of a multipath memory according to configurable sequential testing sequences applied to independently control individual cells of the memory.

FIG. 2 illustrates an example circuit 200 for testing and controlling cells of a multipath memory according to configurable sequential testing sequences applied to independently control individual cells of the memory. The circuit 200 includes a multipath memory having multiple cells 1 through N and a plurality of sequence generators 1 through N. Each sequence generator of the plurality of sequence generators 1-N drives one separate cell of the multiple cells 1-N via an automatic test pattern generator (ATPG) mode signal 1-N for each cell. The ATPG mode signal 1-N for each cell is configured via a sequence configuration input SEQ CONFIG 1-N that controls a number of test pulses and a pulse width for the test pulses to test each cell 1-N. As shown, each cell 1-N of the multipath memory includes a memory array 1 through N to store functional data for the cell and an input multiplexer MUX IN 1-N to select between a test interface TEST_INT and a functional interface FUNC_INT in response to a test mode signal (e.g., built in self test signal) TM 1 through TM N that varies between test mode and functional mode.

The test interface TEST_INT provides test data for the cell 1-N via an output of the input multiplexer MUX IN 1-N if the test mode signal TM 1-TM N is in test mode and the functional interface FUNC_INT provides functional data to the memory array via the output of the input multiplexor if the test mode signal is in functional mode. For example, in non-testing mode, the functional interface provides data written to the data array portion of the multipath memory. The functional interface can also be exercised during testing mode as well. A clocked logic array 1-N (e.g., array of test flip-flops) in each cell 1-N is driven from the output of the input multiplexor MUX IN 1-N for each cell. The clocked logic array 1-N receives the test data for the cell in the test mode. An output multiplexer MUX OUT 1-N in each cell selects between the clocked logic array 1-N and the memory array 1-N in response to the ATPG mode signal 1-N. The ATPG mode signal 1-N causes the output multiplexer MUX OUT 1-N to provide clocked logic array output from the cell in test mode and to provide memory array output from the cell in functional mode.

In one example, one of the cells of the multipath memory (e.g., cell 1) includes an error checking and correction (ECC) memory array and another one of the cells (e.g., cell 2) includes a data memory array, where the ECC memory array stores an ECC bit that corresponds to data that is stored in the data memory array. Gate logic 210 can be provided that receives data from the ECC memory array and the data memory array to generate output data corresponding to the data in the ECC memory array or the data memory array. As shown, the sequence generator 1-N can also include a sequence configuration register shown as sequence registers 1-N to configure the number of test pulses and the pulse width for the test pulses of the ATPG mode signal 1-N to test each cell 1-N. Other aspects of programmable timing and configuration of the sequence generators 1-N are described below with respect to FIGS. 5 and 6.

Figure 3:
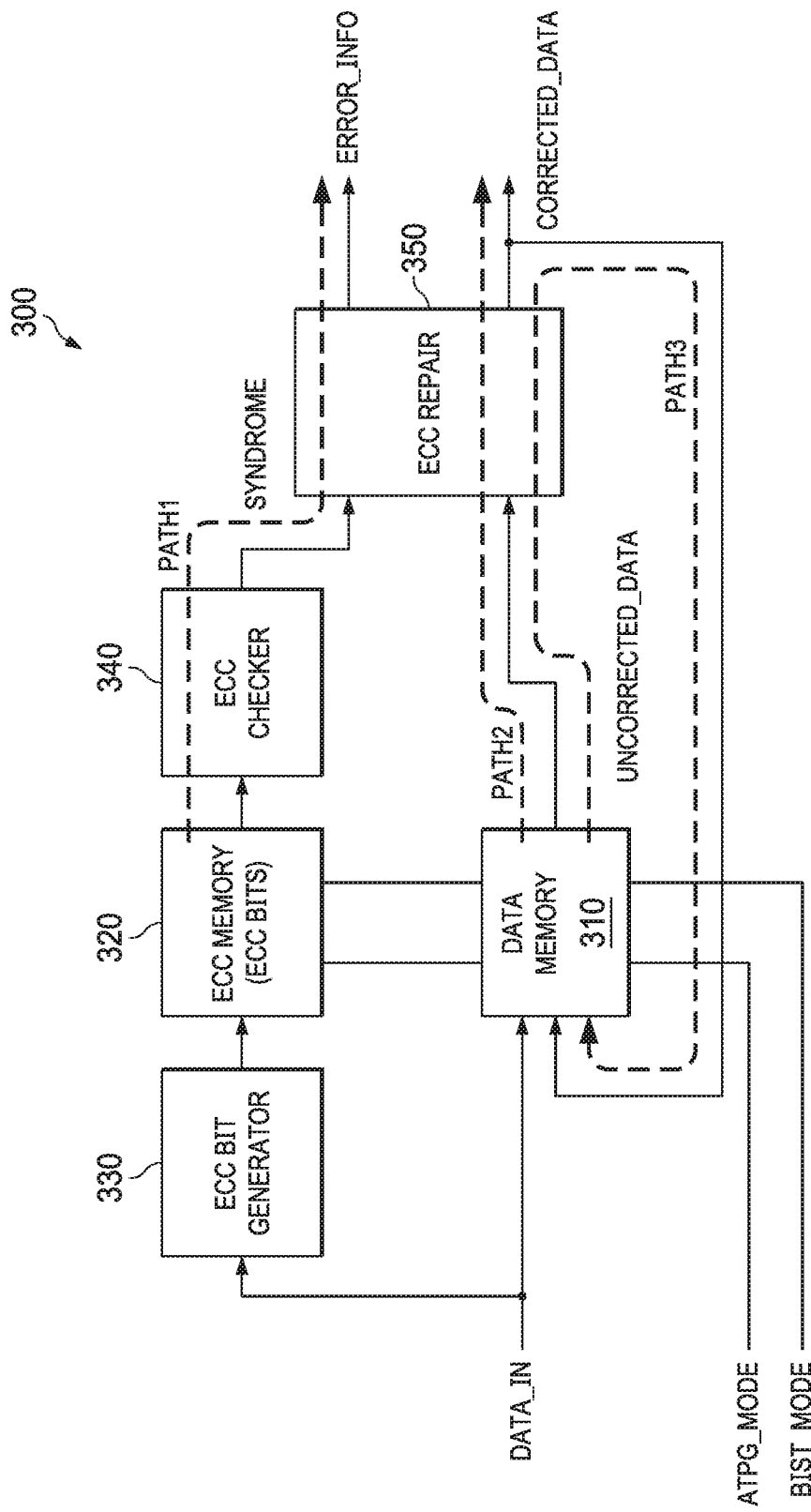
FIG. 3 illustrates an example of a multipath memory having multiple testing paths that can be tested according to configurable sequential testing sequences applied to individual cells of the memory.

FIG. 3 illustrates an example of a multipath memory 300 having multiple testing paths that can be tested according to configurable sequential testing sequences applied to individual cells of the memory. The example multipath memory 300 includes a data path and an error checking and correction path and is but one example of the multipath memories described above with respect to FIGS. 1 and 2. In this example, a data memory 310 and an error checking and correction (ECC) memory 320 collaborate to provide a multipath memory architecture. Data input shown as DATA_IN drives the data memory 310 and an ECC bit generator 330 that in turn provides ECC bits to the ECC memory 320. Output from the ECC memory 320 feeds an ECC checker 340 which provides input to an ECC repair circuit 350 which also receives data output from the data memory 310. The ECC repair circuit 350 can generate corrected data to the ECC memory 310 and provide the corrected data and/or error information to other circuits (e.g., memory supervisor in a processor circuit). An ATPG_MODE signal and BIST_MODE signal (e.g., Test Mode Signal TM of FIG. 2) can selectively control each of the data memory 310 and the ECC memory 320 during functional or testing mode sequences for the multipath memory.

As shown, various testing paths are possible within the multipath memory circuit 300. A first path—PATH 1 for testing is shown through the respective ECC circuits 330, 320, 340, and 350. A second path—PATH 2 is shown from the data memory 310 through the ECC repair circuit 350. A third testing path—PATH 3 exists between the ECC repair 350 and is fed back to the data memory 310. Current testing methods generate complex ATPG patterns to concurrently satisfy testing conditions for both the ECC memory 320 and the data memory 310 of the multipath memory. The programmable sequence generator and associated controls described herein allow for individual and isolated timing control of separate portions of the multipath memory such as the ECC memory 320 and data memory 310 which reduces the complexity of testing patterns generated which in turn increases fault coverage.

Figure 4:
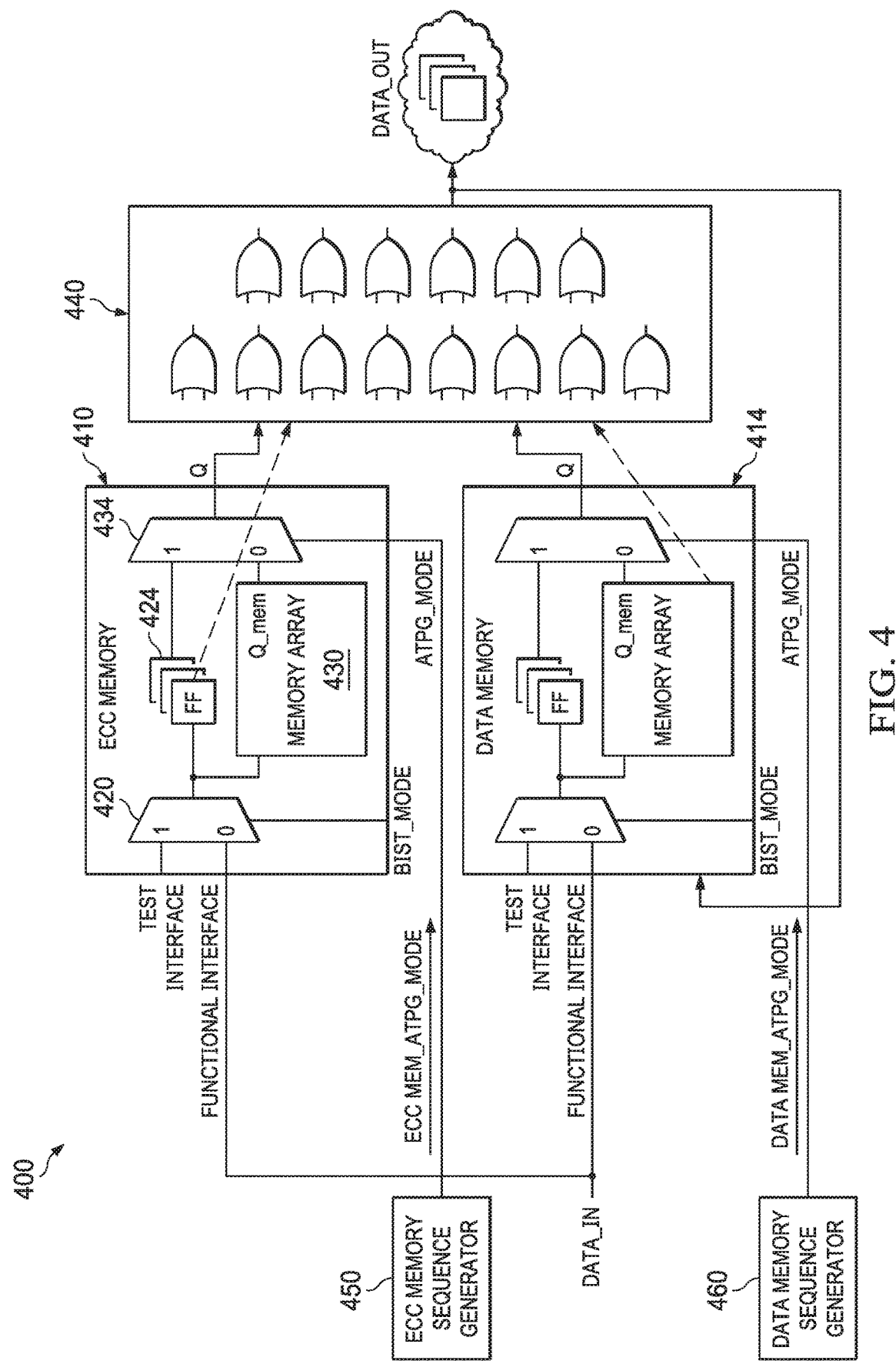
FIG. 4 illustrates an example circuit of an error checking and correction (ECC) memory and data memory that can be tested according to configurable sequential testing sequences applied to the ECC memory and data memory.

FIG. 4 illustrates an example circuit 400 of an error checking and correction (ECC) memory 410 and a data memory 414 that can be tested according to configurable sequential testing sequences applied to the ECC memory and data memory as described herein. Each of the memories 410 and 414 can include an input multiplexor (e.g., MUX IN of FIG. 2), a clocked logic array (e.g., CLK LOG of FIG. 2), a memory array (e.g., MEMORY ARRAY of FIG. 2), and an output multiplexer (e.g., MUX OUT of FIG. 2) such as shown at reference numerals 420, 424, 430, and 434. Each of the memories 410 and 414 can have their respective outputs routed through gate logic 440 (e.g., GATE LOGIC 210 of FIG. 2) to produce a combined data result shown as DATA_OUT. An ECC memory sequence generator 450 (e.g., SEQUNCE GENERATOR of FIG. 2) drives an ATPG mode signal to control whether testing data from the clocked logic array 424 or functional data from the ECC memory array 430 is selected via the output multiplexer 434 of the ECC memory 410. Similarly, a data memory sequence generator 460 drives an ATPG mode signal to control whether testing data from the clocked logic array or functional data from the data memory array data memory 414 is selected via the output multiplexer of the data memory. This allows the timing and test or functional data to be applied in an isolated manner to one portion of the multipath memory (e.g., ECC path or DATA path) while mitigating generation of a complex testing pattern to exercise both paths at the same time. Other timing and configuration aspects for the sequence generators 450 and 460 are described below with respect to FIGS. 5 and 6.

Figure 5:
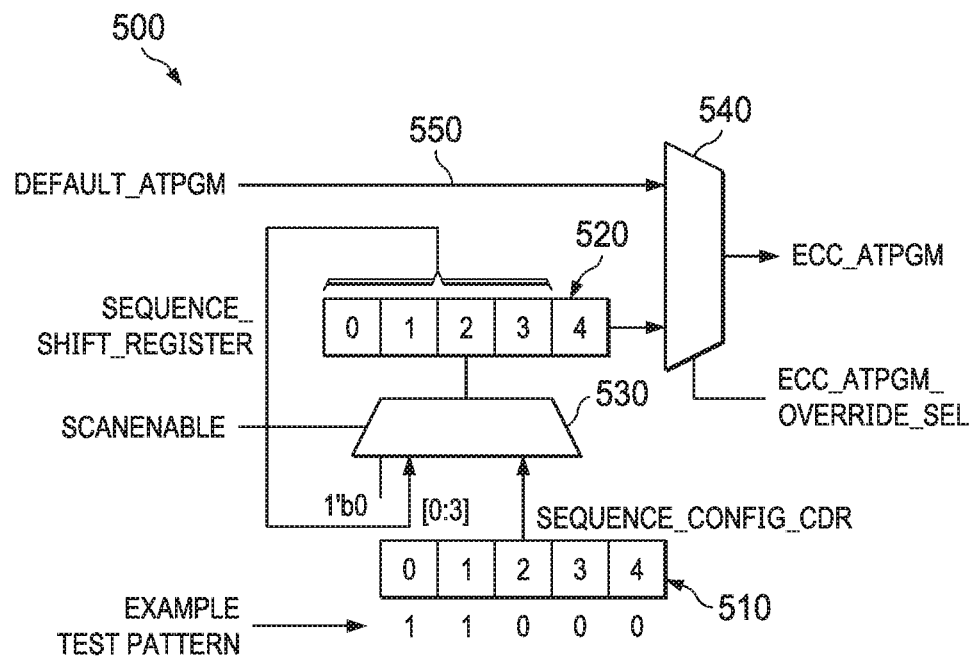
FIG. 5 illustrates an example sequence generator for testing cells of a multipath memory according to configurable sequential testing sequences.
Figure 6:
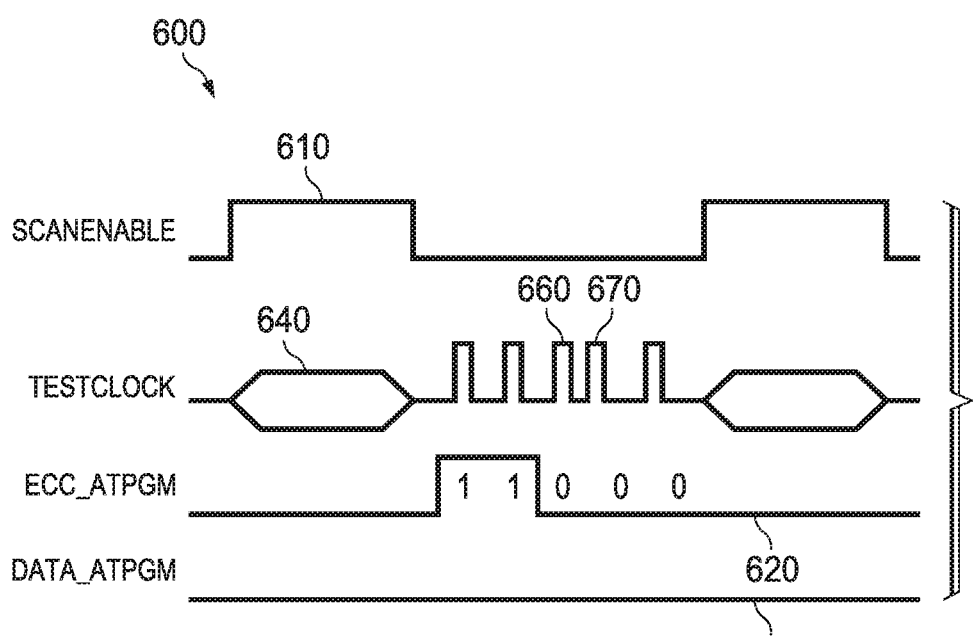
FIG. 6 illustrates an example timing diagram for the sequence generator of FIG. 6 for testing cells of a multipath memory according to configurable sequential testing sequences.

FIG. 5 illustrates an example sequence generator 500 for testing cells of a multipath memory according to configurable sequential testing sequences. To facilitate discussion of FIG. 5, FIG. 6 provides an example timing diagram 600 for the sequence generator of FIG. 5. As shown, the sequence generator 500 (e.g., SEQUNCE GEBNERATOR of FIG. 2) includes a sequence configuration register 510 (e.g., SEQUNCE REGISTER of FIG. 2) to configure the timing sequence of the ATPG mode signal to test each cell. In this example, the sequence generator 500 represents the ECC sequence generator 450 of FIG. 4 however the data sequence generator 460 of FIG. 4 would be similarly configured. The timing sequence can include a number of test pulses and a pulse width for the test pulses of the ATPG mode signal to test each cell. The sequence generator 500 can also include a sequence shift register 520 to generate the timing sequence. The sequence shift register 520 can be loaded in response to a scan enable signal (610 of FIG. 6) that loads the contents of the sequence configuration register 510 via multiplexer 530 into the sequence shift register 520. The sequence generator 500 can also include a multiplexer 540 to drive the ATPG mode signal. The multiplexer 540 selects between the shift register 520 and a default ATPG signal 550 based on an override select signal 560.

In this example, an example test pattern of binary 1 1 0 0 0, is programmed into the sequence configuration register 510. This pattern is overlaid on to an ECC ATPG mode signal 620 which shows how the ATPG mode signal is a function of the programmed configuration value. During the active time of the ECC ATPG mode signal 620, a corresponding DATA ATPG mode signal is held low which correlates to functional data being output from the respective data memory cell. A test clock signal 640 controls timing of the clocked circuits such as the memory arrays and clocked logic arrays described herein. The test clock signal 640 also initiates the delay fault testing described herein where a first pulse 660 initiates a launch cycle of the delay fault test followed by a capture pulse 670 of the delay fault test, wherein the pulses 660 and 670 are initiated after the ECC ATPG signal 620 transitions from high to low. The delay fault testing described herein can operate in accordance with transition fault testing protocols such as a launch on extra/extended shift (LOES) test or a launch off capture (LOC), for example.

Figure 7:
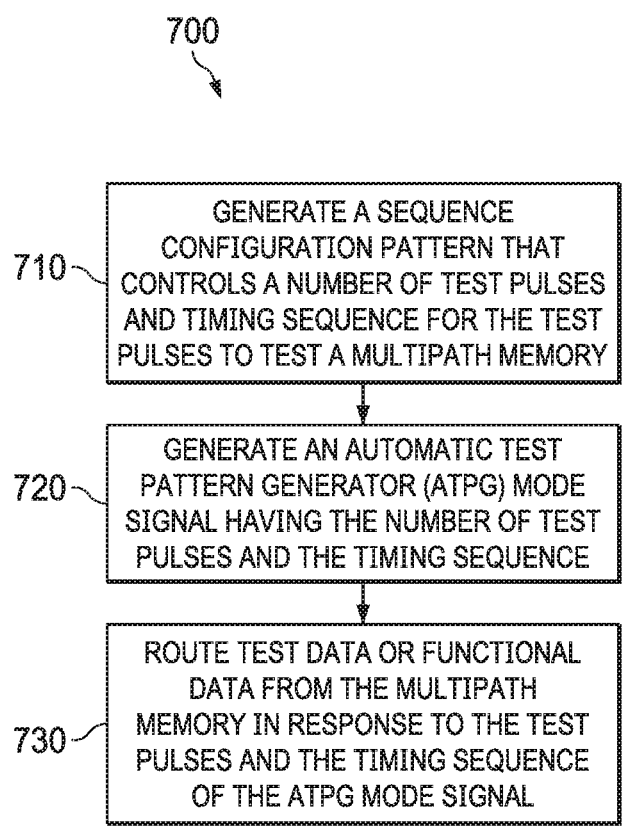
FIG. 7 illustrates an example method for testing cells of a multipath memory according to configurable sequential testing sequences applied to individual cells of the memory.

In view of the foregoing structural and functional features described above, an example method will be better appreciated with reference to FIG. 7. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured as machine readable instructions stored in memory and executable in an integrated circuit or a processor, for example.

FIG. 7 illustrates an example method 700 for testing cells of a multipath memory according to configurable sequential testing sequences applied to individual cells of the memory. At 710, the method 700 includes generating a sequence configuration pattern that controls a number of test pulses and timing sequence for the test pulses to test a multipath memory (e.g., via sequence register 1-N of FIG. 2). At 720, the method 700 includes generating an automatic test pattern generator (ATPG) mode signal having the number of test pulses and the timing sequence in response to the sequence configuration pattern (via sequence generator 1-N of FIG. 2). At 730, the method 700 includes routing test data or functional data from the multipath memory in response to the test pulses and the timing sequence of the ATPG mode signal (e.g., via output multiplexer 1-N of FIG. 2). In one example, the multipath memory includes an error checking and correction (ECC) memory array and a data memory array. The ECC memory array stores an ECC bit that corresponds to data that is stored in the data memory array. The method can include selecting between a test interface and a functional interface in response to a test mode signal that varies between test mode and functional mode. The test interface provides test data for the multipath memory if the test mode signal is in test mode and the functional interface provides functional data to the memory array if the test mode signal is in functional mode. The method can also include selecting between a clocked logic array that receives the test data and the memory array that receives the functional data in response to the ATPG mode signal. The ATPG mode signal causes the clocked logic array output to be routed from the multipath memory in test mode and the memory array output to be routed from the multipath memory in functional mode.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
    a multipath memory having multiple cells; and
    a plurality of sequence generators, each sequence generator of the plurality of sequence generators drives one separate cell of the multiple cells via an automatic test pattern generator (ATPG) mode signal for each cell and comprises a sequence configuration register to configure a timing sequence of the ATPG mode signal to test each cell,
    the ATPG mode signal for each cell is configured via a sequence configuration input that controls the timing sequence for testing each cell, wherein the ATPG mode signal for each cell indicates whether test data or functional data is output from the respective cell.

2. The circuit of claim 1, wherein each cell of the multipath memory includes a memory array, one of the cells includes an error checking and correction (ECC) memory array and another one of the cells includes a data memory array, the ECC memory array stores an ECC bit that corresponds to data that is stored in the data memory array.

3. The circuit of claim 2, further comprising gate logic that receives data from the ECC memory array and the data memory array to generate output data corresponding to the data in the ECC memory array or the data memory array.

4. The circuit of claim 2, further comprising an input multiplexer to select between a test interface and a functional interface in response to a test mode signal that varies between test mode and functional mode, wherein the test interface provides test data for the cell via an output of the input multiplexer if the test mode signal is in test mode and the functional interface provides functional data to the memory array via the output of the input multiplexor if the test mode signal is in functional mode.

5. The circuit of claim 4, further comprising a clocked logic array that is driven from the output of the input multiplexor, the clocked logic array receives the test data for the cell in the test mode.

6. The circuit of claim 5, further comprising an output multiplexer to select between the clocked logic array and the memory array in response to the ATPG mode signal, the ATPG mode signal causes the output multiplexer to provide clocked logic array output from the cell in test mode and to provide memory array output from the cell in functional mode.

7. The circuit of claim 1, wherein the timing sequence includes a number of test pulses and a pulse width for the test pulses of the ATPG mode signal to test each cell.

8. The circuit of claim 1, wherein the sequence generator further comprises a sequence shift register to generate the timing sequence, the sequence shift register is loaded in response to a scan enable signal that loads the contents of the sequence configuration register into the sequence shift register.

9. The circuit of claim 8, wherein the sequence generator further comprises a multiplexer to drive the ATPG mode signal, the multiplexer selects between the sequence shift register and a default ATPG signal based on an override select signal.

10. A circuit, comprising:
a multipath memory having multiple cells; and
a plurality of sequence generators, each sequence generator of the plurality of sequence generators drives one separate cell of the multiple cells via an automatic test pattern generator (ATPG) mode signal for each cell,
the ATPG mode signal for each cell is configured via a sequence configuration input that controls a number of test pulses and a pulse width for the test pulses to test each cell,
each cell of the multipath memory includes:
a memory array to store functional data for the cell;
an input multiplexer to select between a test interface and a functional interface in response to a test mode signal that varies between test mode and functional mode, the test interface provides test data for the cell via an output of the input multiplexer if the test mode signal is in test mode and the functional interface provides functional data to the memory array via the output of the input multiplexor if the test mode signal is in functional mode;
a clocked logic array that is driven from the output of the input multiplexor, the clocked logic array receives the test data for the cell in the test mode; and
an output multiplexer to select between the clocked logic array and the memory array in response to the ATPG mode signal, the ATPG mode signal causes the output multiplexer to provide clocked logic array output from the cell in test mode and to provide memory array output from the cell in functional mode.

11. The circuit of claim 10, wherein one of the cells of the multipath memory includes an error checking and correction (ECC) memory array and another one of the cells includes a data memory array, the ECC memory array stores an ECC bit that corresponds to data that is stored in the data memory array.

12. The circuit of claim 11, further comprising gate logic that receives data from the ECC memory array and the data memory array to generate output data corresponding to the data in the ECC memory array or the data memory array.

13. The circuit of claim 10, wherein the sequence generator further comprises a sequence configuration register to configure the number of test pulses and the pulse width for the test pulses of the ATPG mode signal to test each cell.

14. The circuit of claim 13, wherein the sequence generator further comprises a sequence shift register to generate the number of test pulses and the pulse width for the test pulses, the sequence shift register is loaded in response to a scan enable signal that loads the contents of the sequence configuration register into the sequence shift register.

15. The circuit of claim 14, wherein the sequence generator further comprises a multiplexer to drive the ATPG mode signal, the multiplexer selects between the sequence shift register and a default ATPG signal based on an override select signal.

16. A method, comprising:
receiving a sequence configuration pattern signal that indicates a number of test pulses to test a multipath memory and a timing sequence;
generating an automatic test pattern generator (ATPG) mode signal for a call, the ATPG mode signal having the number of test pulses and the timing sequence indicated by the sequence configuration pattern and the ATPG mode signal indicates whether test data or functional data is output from a cell; and
selecting between a clocked logic array that receives the test data and a memory array that receives the functional data in response to the ATPG mode signal, the ATPG mode signal causes output from the clocked logic array to be routed from the multipath memory in test mode and the memory array output to be routed from the multipath memory in functional mode.

17. The method of claim 16, wherein the multipath memory includes an error checking and correction (ECC) memory array and a data memory array, the ECC memory array stores an ECC bit that corresponds to data that is stored in the data memory array.

18. The method of claim 17, further comprising selecting between a test interface and a functional interface in response to a test mode signal that varies between test mode and functional mode, wherein the test interface provides test data for the multipath memory if the test mode signal is in test mode and the functional interface provides functional data to the memory array if the test mode signal is in functional mode.

* * * * *